US008179487B2

(12) United States Patent
Chou et al.

(10) Patent No.: US 8,179,487 B2
(45) Date of Patent: May 15, 2012

(54) THIN FILM TRANSISTOR ARRAY SUBSTRATE

(75) Inventors: Yu-Hui Chou, Taichung County (TW); Pei-Chun Liao, Changhua County (TW); Hsueh-Ying Huang, Taipei County (TW)

(73) Assignee: Au Optronics Corporation, Hsinchu (TW)

( * ) Notice: Subject to any disclaimer, the term of this patent is extended or adjusted under 35 U.S.C. 154(b) by 215 days.

(21) Appl. No.: 12/233,611

(22) Filed: Sep. 19, 2008

(65) Prior Publication Data
US 2009/0195720 A1 Aug. 6, 2009

(30) Foreign Application Priority Data

Feb. 1, 2008 (TW) ................................ 97103931 A

(51) Int. Cl.
G02F 1/1343 (2006.01)
G02F 1/1333 (2006.01)

(52) U.S. Cl. ........................................................ 349/38
(58) Field of Classification Search ...................... 349/38
See application file for complete search history.

(56) References Cited

U.S. PATENT DOCUMENTS

| 6,160,535 | A | 12/2000 | Park |
| 6,310,668 | B1 * | 10/2001 | Ukita ............................. 349/42 |
| 6,822,718 | B2 | 11/2004 | Choi et al. |
| 7,262,824 | B2 * | 8/2007 | Sasabayashi et al. .......... 349/129 |
| 7,304,691 | B2 * | 12/2007 | Song et al. ...................... 349/39 |
| 2004/0252249 | A1 | 12/2004 | Hong |
| 2007/0097072 | A1 | 5/2007 | Kim et al. |
| 2009/0284703 | A1 * | 11/2009 | Shoraku et al. ............... 349/129 |

FOREIGN PATENT DOCUMENTS

| CN | 1629688 | 6/2005 |
| CN | 1798999 | 7/2006 |
| JP | 11-231343 | 8/1999 |
| JP | 2006-259244 | 9/2006 |
| TW | I287685 | 10/2007 |
| WO | 2006/035887 | 4/2006 |

OTHER PUBLICATIONS

"1st Office Action of China counterpart application", issued on Sep. 25, 2009, p. 1-p. 6.
"Office Action of Taiwan Counterpart Application", issued on Jan. 11, 2012, p1-p7, in which the listed reference was cited.

* cited by examiner

Primary Examiner — Eric Wong
(74) Attorney, Agent, or Firm — Jianq Chyun IP Office

(57) ABSTRACT

A thin film transistor (TFT) array substrate including a substrate, a plurality of scan lines disposed on the substrate, a plurality of data lines disposed on the substrate, and a plurality of pixels arranged in array on the substrate is provided. Each scan line is connected to a row of pixels. Each pixel includes a TFT and a pixel electrode, wherein the pixel electrode is connected to one of the scan lines and one of the data lines through the TFT. In the same column of pixels, the TFTs are connected to two adjacent data lines alternatively and aligned in the column direction. At least one of the pixels further includes a capacitance compensating line. In the pixel having the capacitance compensating line, the TFT is connected to one of the adjacent two data lines, and the capacitance compensating line is connected to the other one.

16 Claims, 6 Drawing Sheets

THIN FILM TRANSISTOR ARRAY SUBSTRATE

CROSS-REFERENCE TO RELATED APPLICATION

This application claims the priority benefit of Taiwan application serial no. 97103931, filed on Feb. 1, 2008. The entirety of the above-mentioned patent application is hereby incorporated by reference herein and made a part of specification.

BACKGROUND OF THE INVENTION

1. Field of the Invention

The present invention generally relates to a thin film transistor (TFT) array substrate, in particular, to a TFT array substrate with capacitance compensating lines.

2. Description of Related Art

In recent years, the development of liquid crystal display television (LCD-TV) has been developed toward high resolution and large size. In a large-sized LCD panel, signal distortion may be caused due to overall RC delay of the LCD panel. Accordingly, the driver IC in a large-sized LCD panel has to be designed with strong driving capability in order to maintain the display uniformity of the LCD panel at a specific standard. On the other hand, in a high-resolution display panel having a driving frequency of 120 Hz (Full HD; 1920× 1080), overheat issue on the driver IC may be caused because of the high polarity conversion frequency when a general dot inversion driving method is adopted to improve the image quality of the display panel. In this case, overheat issue on the driver IC can be significantly reduced if the polarity conversion frequency of the driver IC can be reduced. Accordingly, the problems of overheat issue on the driver IC and RC delay can be resolved when a column inversion driving method can be adopted for driving the display panel.

However, there are still some other problems in image presentation to be resolved even if the column inversion driving method is adopted. For example, bright/dark lines and serious cross-talk may be produced when dynamic images are displayed. To resolve these problems, an alternative type pixel layout is disclosed in U.S. Pat. No. 6,822,718, when the display panel having the above-mentioned alternative type pixel layout is driven through column inversion driving method, the display quality thereof is similar with the display quality provided by display panel that is driven through dot inversion driving method. Since the problem of overheat issue on driver IC will not be produced by the column inversion driving method, the problems of bright/dark lines, cross-talk, and overheat issue on driver IC can all be effectively resolved by the U.S. Pat. No. 6,822,718. However, it should be noted that in the pixel layout provided by the U.S. Pat. No. 6,822,718, TFTs are disposed alternatively and which reduces the regularity of the photomask pattern used for fabricating the TFTs. Accordingly, mis-alignment may occur and black matrix having sufficient area is required to prevent light-leakage. As a result, both the aperture ratio of the display area and the size of the display area are reduced.

SUMMARY OF THE INVENTION

Accordingly, the present invention is directed to a thin film transistor (TFT) array substrate, wherein the aperture ratio of a display area maintains or remains unreduced.

The present invention is directed to a TFT array substrate, wherein parasitic capacitances between pixels are balanced and thus inconsistent parasitic capacitances between pixels are reduced.

The present invention provides a TFT array substrate including a substrate, a plurality of scan lines disposed on the substrate, a plurality of data lines disposed on the substrate, and a plurality of pixels arranged in array on the substrate. Each of the scan lines is electrically connected to a row of pixels. Each of the pixels includes a TFT and a pixel electrode, wherein the pixel electrode is electrically connected to one of the scan lines and one of the data lines through the TFT. In the same column of pixels, the TFTs are electrically connected to adjacent two data lines alternatively and are aligned in the column direction, wherein at least one of the pixels includes a capacitance compensating line, and in the pixel having the capacitance compensating line, the TFT is electrically connected to one of the adjacent two data lines, and the capacitance compensating line is electrically connected to the other adjacent data line.

According to an embodiment of the present invention, the pixels includes a plurality of first pixel rows and a plurality of second pixel rows, each of the first pixel rows includes a plurality of first pixels, and each of the second pixel rows includes a plurality of second pixels, wherein the first pixel rows and the second pixel rows are arranged alternatively along the column direction.

According to an embodiment of the present invention, each of the first pixels includes a first TFT and a first pixel electrode electrically connected to the first TFT, and the capacitance compensating line includes a first capacitance compensating pattern, wherein the first TFT is electrically connected to one of the adjacent two data lines, and the first capacitance compensating pattern is electrically connected to the other adjacent data line.

According to an embodiment of the present invention, the distances between the first TFT and the adjacent two data lines are different.

According to an embodiment of the present invention, each of the second pixels includes a second TFT and a second pixel electrode electrically connected to the second TFT.

According to an embodiment of the present invention, the distances between the first TFT and the adjacent two data lines are substantially the same. In the present embodiment, each of the second pixels includes a second TFT and a second pixel electrode electrically connected to the second TFT, and the capacitance compensating line includes a second capacitance compensating pattern, wherein the second TFT is electrically connected to one of the adjacent two data lines, and the second capacitance compensating pattern is electrically connected to the other adjacent data line.

According to an embodiment of the present invention, each of the pixels further includes a first shielding pattern and a second shielding pattern, wherein the first shielding pattern is disposed at the edge of the pixel electrode and adjacent to one of the adjacent two data lines, the second shielding pattern is disposed at the edge of the pixel electrode and adjacent to the other adjacent data line, and the areas of the first shielding pattern and the second shielding pattern are different.

According to an embodiment of the present invention, the first shielding pattern and the second shielding pattern are strip patterns extended in substantially the same direction as the data lines, the widths of the first shielding pattern and the second shielding pattern are substantially the same, and the lengths of the first shielding pattern and the second shielding pattern are different.

According to an embodiment of the present invention, the TFT array substrate may further include a common line disposed on the substrate, and the first shielding patterns and the second shielding patterns are electrically connected to the common line.

According to an embodiment of the present invention, the TFT array substrate include a common line disposed on the substrate.

According to an embodiment of the present invention, the pixel electrode includes a bright region sub-pixel electrode and a dark region sub-pixel electrode. Besides, the TFT array substrate may further include an auxiliary transistor, and the dark region sub-pixel electrode is electrically connected to one of the scan lines and one of the data lines through the auxiliary transistor.

The present invention provides a TFT array substrate including a substrate, a first data line, a second data line, a first scan line, a second scan line, a first pixel, a second pixel, and a first capacitance compensating line. The substrate has a first pixel region and an adjacent second pixel region. The first data line and the second data line are respectively disposed in parallel on the substrate beside the first pixel region and the second pixel region, and the first pixel region and the second pixel region are located between the first data line and the second data line. The first scan line and the second scan line are disposed on the substrate and are perpendicular to the first data line and the second data line. The first pixel includes a first TFT and a first pixel electrode, wherein the first pixel electrode is electrically connected to the first scan line and the first data line through the first TFT. The second pixel includes a second TFT and a second pixel electrode, wherein the second pixel electrode is electrically connected to the second scan line and the second data line through the second TFT, and the second TFT has a second extended source electrode. The first capacitance compensating line is electrically connected to the second data line, and the compensation capacitance produced by the first capacitance compensating line is used for compensating the parasitic capacitance produced by the second extended source electrode.

According to an embodiment of the present invention, the distance between the first TFT and the first data line is different from the distance between the first TFT and the second data line.

According to an embodiment of the present invention, the distance between the first TFT and the first data line is substantially the same as the distance between the first TFT and the second data line.

According to an embodiment of the present invention, the TFT array substrate may further include a second capacitance compensating pattern electrically connected to the first data line.

According to an embodiment of the present invention, the first TFT has a first extended source electrode, and the compensation capacitance produced by the second capacitance compensating line is used for compensating the parasitic capacitance produced by the first extended source electrode.

According to an embodiment of the present invention, the TFT array substrate may further include a first shielding pattern and a second shielding pattern, wherein the first shielding pattern is disposed at the edges of the first pixel electrode and the second pixel electrode and adjacent to the first data line, the second shielding pattern is disposed at the edges of the first pixel electrode and the second pixel electrode and adjacent to the second data line, and the areas of the first shielding pattern and the second shielding pattern are different.

According to an embodiment of the present invention, the first shielding pattern and the second shielding pattern are strip patterns extended in substantially the same direction as the first data line and the second data line, the widths of the first shielding pattern and the second shielding pattern are substantially the same, and the lengths of the first shielding pattern and the second shielding pattern are different.

According to an embodiment of the present invention, the TFT array substrate may further include a common line disposed on the substrate, wherein the first shielding pattern and the second shielding pattern are electrically connected to the common line.

According to an embodiment of the present invention, the TFT array substrate may further include a common line disposed on the substrate.

According to an embodiment of the present invention, the first pixel electrode and the second pixel electrode respectively include a bright region sub-pixel electrode and a dark region sub-pixel electrode. Besides, each of the dark region sub-pixel electrodes is electrically connected to one of the scan lines and one of the data lines through an auxiliary transistor.

According to the present invention, a capacitance compensating line is disposed in a TFT array substrate such that inconsistent parasitic capacitances between pixels are effectively reduced. Moreover, in some embodiments of the present invention, the shielding patterns disposed at the edges of pixel electrodes further reduce the inconsistent parasitic capacitances between pixels.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

Reference will now be made in detail to the present preferred embodiments of the invention, examples of which are illustrated in the accompanying drawings. Wherever possible, the same reference numbers are used in the drawings and the description to refer to the same or like parts.

DESCRIPTION OF THE EMBODIMENTS

First Embodiment

Figure 1:
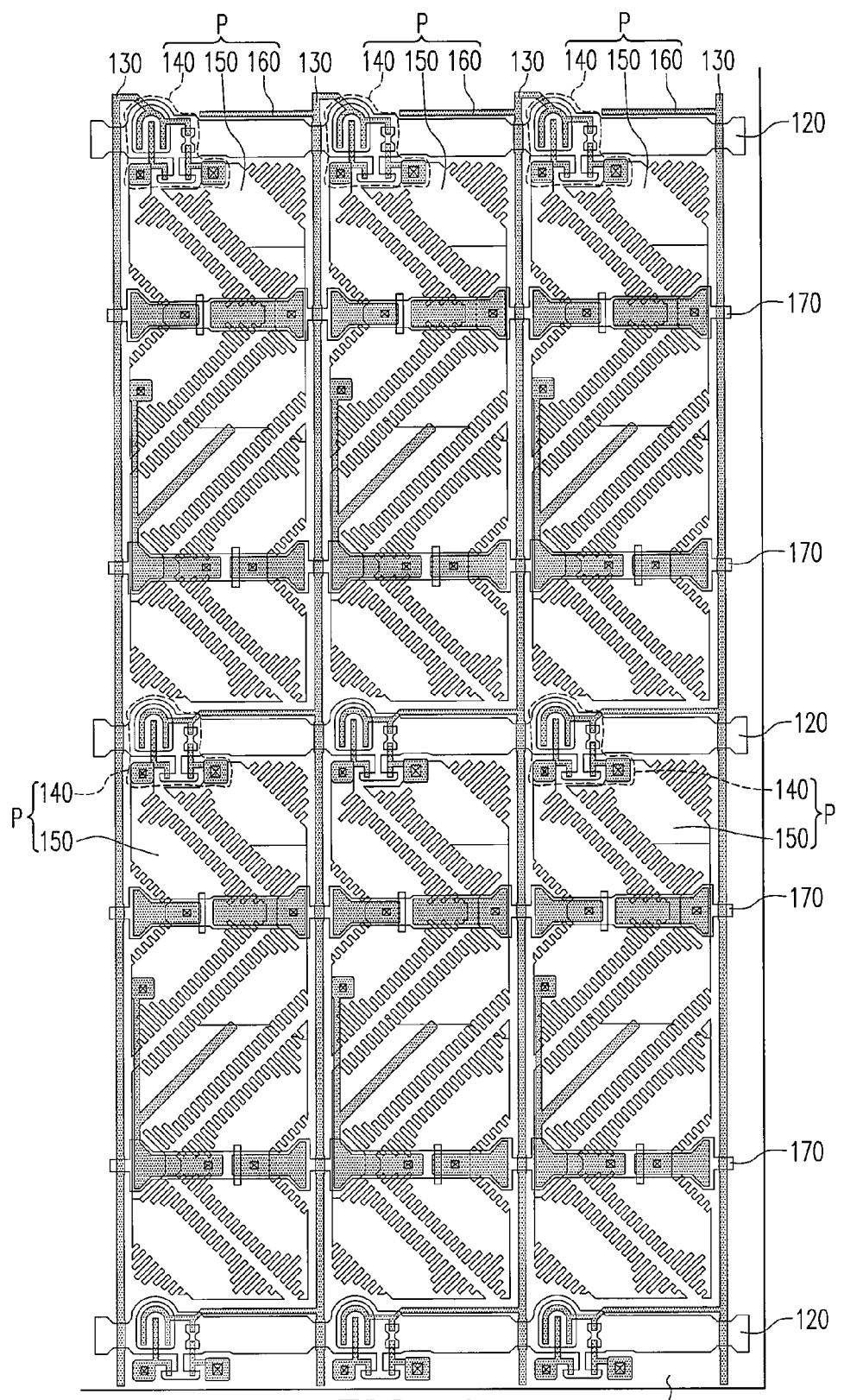
FIG. 1 is a diagram of a thin film transistor (TFT) array substrate according to a first embodiment of the present invention.

FIG. 1 is a diagram of a thin film transistor (TFT) array substrate according to the first embodiment of the present invention. Referring to FIG. 1, in the present embodiment, the TFT array substrate 100 includes a substrate 110, a plurality of scan lines 120 disposed on the substrate 110, a plurality of data lines 130 disposed on the substrate 110, and a plurality of pixels P arranged in array on the substrate 110. Each of the scan lines 120 is electrically connected to a row of the pixels P. Each pixel P includes a TFT 140 and a pixel electrode 150, wherein the pixel electrode 150 is electrically connected to one of the scan lines 120 and one of the data lines 130 through the TFT 140. As shown in FIG. 1, in the same column of pixels P, the TFTs 140 are electrically connected to adjacent two data lines 130 alternatively and aligned in the column direction, wherein at least one of the pixels P (the pixels P on the upper portion of FIG. 1) further include a capacitance compensating line 160, and in the pixels P having the capacitance compensating line 160, the TFT 140 is electrically connected to one of the adjacent two data lines 130 (for example, the data line 130 at the left side), and the capacitance compensating line 160 is electrically connected to the other adjacent data line 130 (for example, the data line 130 at the right side).

As shown in FIG. 1, in the present embodiment, the TFT array substrate 100 may further include one or multiple common lines 170 disposed on the substrate 110. To be specific, the common lines 170 may be located at the pixels P.

The pixel layout in the present embodiment will be described in detail with reference to FIG. 2, wherein two adjacent pixels P are described as an example.

Figure 2:
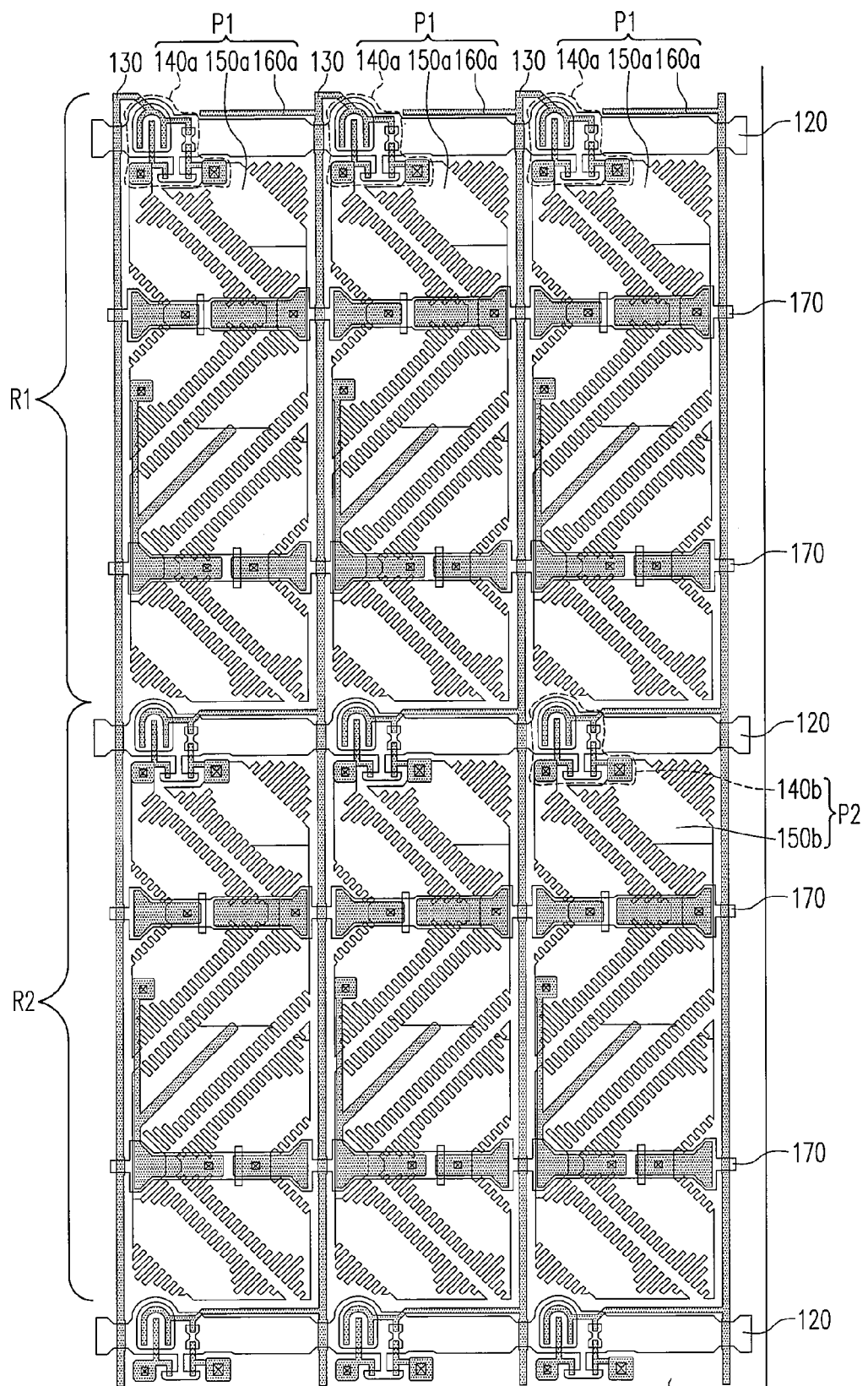
FIG. 2 is a diagram illustrating first pixels P1 and adjacent second pixels P2.

FIG. 2 is a diagram illustrating first pixels P1 and adjacent second pixels P2. Referring to FIG. 2, in the present embodiment, the pixels P include a plurality of first pixel rows R1 and a plurality of second pixel rows R2. Each of the first pixel rows R1 includes a plurality of first pixels P1, and each of the second pixel rows R2 includes a plurality of second pixels P2, wherein the first pixel rows R1 and the second pixel rows R2 are arranged alternatively along the column direction. As shown in FIG. 2, each of the first pixels P1 includes a first TFT 140a and a first pixel electrode 150a electrically connected to the first TFT 140a, and the capacitance compensating line 160 may be a first capacitance compensating pattern 160a, wherein the first TFT 140a is electrically connected to one of the adjacent two data lines 130 (for example, the data line 130 at the left side), and the first capacitance compensating pattern 160a is electrically connected to the other adjacent data line 130 (for example, the data line 130 at the right side). Besides, each of the second pixels P2 includes a second TFT 140b and a second pixel electrode 150b electrically connected to the second TFT 140b.

Figure 3:
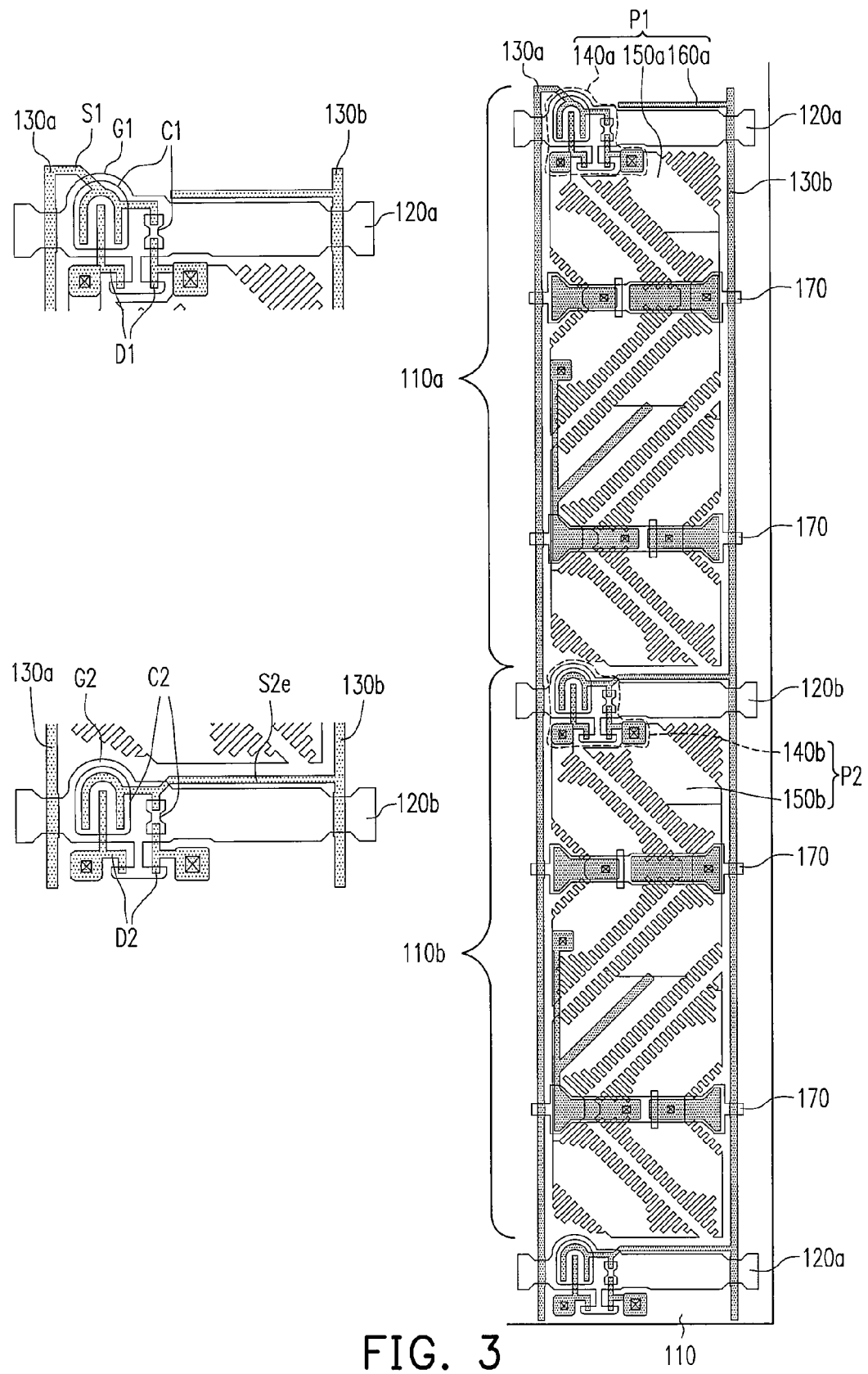
FIG. 3 is a diagram illustrating a first pixel P1 and a second pixel P2.

FIG. 3 is a diagram illustrating a first pixel P1 and a second pixel P2. Referring to FIG. 3, the substrate 110 has a first pixel region 110a and an adjacent second pixel region 110b, wherein the first pixel P1 is disposed in the first pixel region 110a, and the second pixel P2 is disposed in the second pixel region 110b. The first data line 130a and the second data line 130b are respectively disposed in parallel on the substrate 110 beside the first pixel region 110a and the second pixel region 110b, and the first pixel region 110a and the second pixel region 110b are located between the first data line 130a and the second data line 130b. The first scan line 120a and the second scan line 120b are disposed on the substrate 110 and are perpendicular to the first data line 130a and the second data line 130b.

As shown in FIG. 3, the first pixel electrode 150a is electrically connected to the first scan line 120a and the first data line 130a through the first TFT 140a, and the second pixel electrode 150b is electrically connected to the second scan line 120b and the second data line 130b through the second TFT 140b. It should be noted that the first TFT 140a has a first gate electrode G1, a first channel layer C1, a first source electrode S1, and a first drain electrode D1, and the second TFT 140b has a second gate electrode G2, a second channel layer C2, a second extended source electrode S2e, and a second drain electrode D2. In addition, the first capacitance compensating pattern 160a is electrically connected to the second data line 130b. Since the second extended source electrode S2e connected to the second data line 130b is obviously longer than the first source electrode S1, the first capacitance compensating pattern 160a of the present embodiment is disposed in the first pixel P1. In other words, the compensation capacitance produced by the first capacitance compensating pattern 160a is used for compensating the parasitic capacitance produced by the second extended source electrode S2e.

In the present embodiment, the distances between the first TFT 140a and the two data lines 130a and 130b are different. To be specific, the distance between the first TFT 140a and the first data line 130a is shorter than the distance between the first TFT 140a and the second data line 130b; similarly, the distance between the second TFT 140b and the first data line 130a is shorter than the distance between the second TFT 140b and the second data line 130b. Accordingly, the distance between the first TFT 140a and the first data line 130a is substantially the same as the distance between the second TFT 140b and the first data line 130a, and the distance between the first TFT 140a and the second data line 130b is also substantially the same as the distance between the second TFT 140b and the second data line 130b. Such a design allows the first TFT 140a and the second TFT 140b to be located on the same column and both at the bottom left to the pixels, so that the regularity of the pattern is increased and mis-alignment is reduced. Compared to the conventional technique, both the size of the display area and the aperture ratio of the display area are maintained at higher standards.

Second Embodiment

Figure 4:
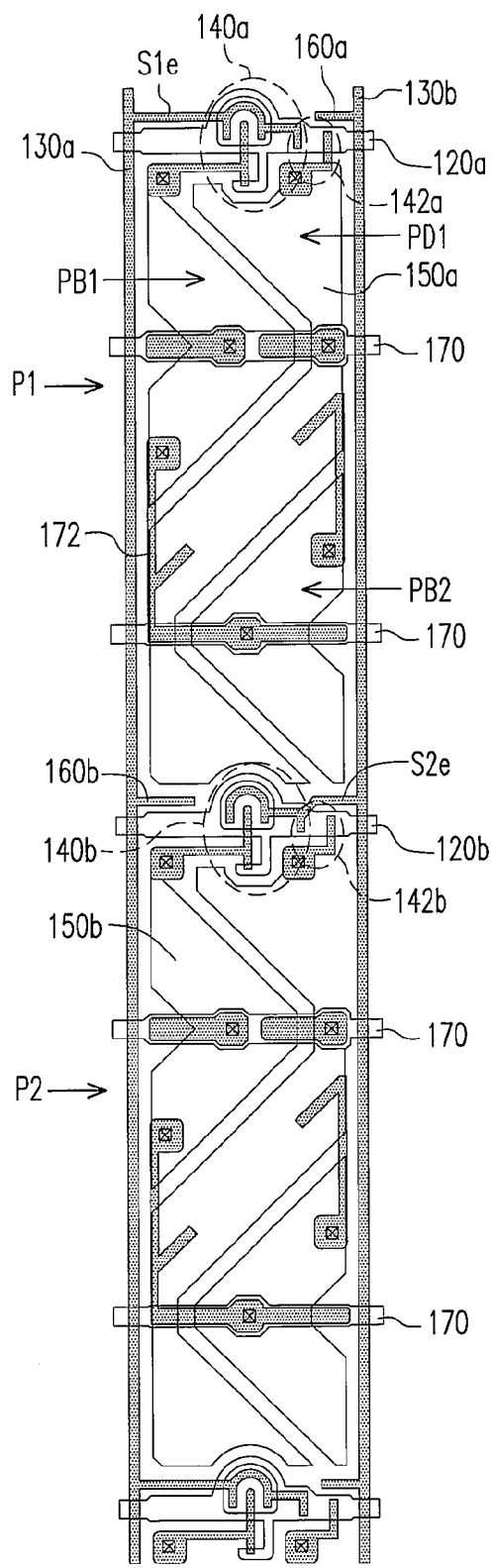
FIG. 4 is a diagram illustrating a first pixel P1 and a second pixel P2 according to a second embodiment of the present invention.

FIG. 4 is a diagram illustrating a first pixel P1 and a second pixel P2 according to the second embodiment of the present invention. Referring to FIG. 4, the layout of the first pixel P1 and the second pixel P2 in the present embodiment is similar to that illustrated in FIG. 3, and the difference between the two is that in the present embodiment, the distance between the first TFT 140a and the first data line 130a is substantially the same as the distance between the first TFT 140a and the second data line 130b, and similarly, the distance between the second TFT 140b and the first data line 130a is substantially the same as the distance between the second TFT 140b and the second data line 130b. It should be noted that the first TFT 140a has a first extended source electrode S1e, and the second TFT 140b has a second extended source electrode S2e, wherein the lengths of the first extended source electrode S1e and the second extended source electrode S2e are substantially the same. The first capacitance compensating pattern 160a is electrically connected to the second data line 130b. Such a design allows the distance between the first TFT 140a and the first data line 130a to be substantially the same as the distance between the second TFT 140b and the first data line 130a and similarly, the distance between the first TFT 140a and the second data line 130b to be substantially the same as the distance between the second TFT 140b and the second data line 130b, so that the first TFT 140a and the second TFT 140b are located on the same column and right below the pixels. As a result, the regularity of the pattern is increased and alignment error is reduced. Compared to the conventional technique, both the size of the displayable area and the aperture ratio of the display area are maintained at higher standards.

In the present embodiment, the capacitance compensating line 160 may further include a second capacitance compensating pattern 160b besides the first capacitance compensating pattern 160a. In this case, the second TFT 140b is electrically connected to the second data line 130b, and the second capacitance compensating pattern 160b is electrically connected to the first data line 130a. Because the first extended source electrode S1e is connected to the first data line 130b, in the present embodiment, the second capacitance compensating pattern 160b is further disposed in the second pixel P2. In other words, the compensation capacitance produced by the second capacitance compensating pattern 160b is used for compensating the parasitic capacitance produced by the first extended source electrode S1e.

Third Embodiment

The pixels P1 and P2 in the first and the second embodiment respectively have an advanced multi-domain vertically alignment (AMVA) layout. In another embodiment of the present invention, the pixels P1 and P2 includes a bright region (main-pixel region) and a dark region (sub-pixel region), and the pixel electrodes 140a and 140b may be respectively divided into a bright region sub-pixel electrode PB1 and a dark region sub-pixel electrode PD1. Such a design increases the display uniformity and prevents color shift at large viewing angles. The dark region sub-pixel electrode PD1 of the pixel P1 can be electrically connected to the corresponding scan line 120a and data line 130a through an auxiliary transistor 142a, and similarly, the dark region sub-pixel electrode PD1 of the pixel P2 can be electrically connected to the corresponding scan line and data line through an auxiliary transistor 142b. The dark region sub-pixel electrode PD1 may also be electrically coupled to the bright region sub-pixel electrode PB1 to achieve similar effect. Additionally, a bright region sub-pixel electrode PB2 may be further divided from the bright region sub-pixel electrode PB1, and the bright region sub-pixel electrode PB1 is electrically connected to the bright region sub-pixel electrode PB2 through a connection line 172 so as to increase the display viewing angle. Moreover, the capacitance compensating line 160 (the first capacitance compensating pattern 160a and the second capacitance compensating pattern 160b) in the present invention may also be applied to other types of pixel layouts. In the present embodiment, the AMVA pixel layout is only described as an example, and other bright/dark region designs may also be adopted by those skilled in the art according to the present disclosure.

Figure 5:
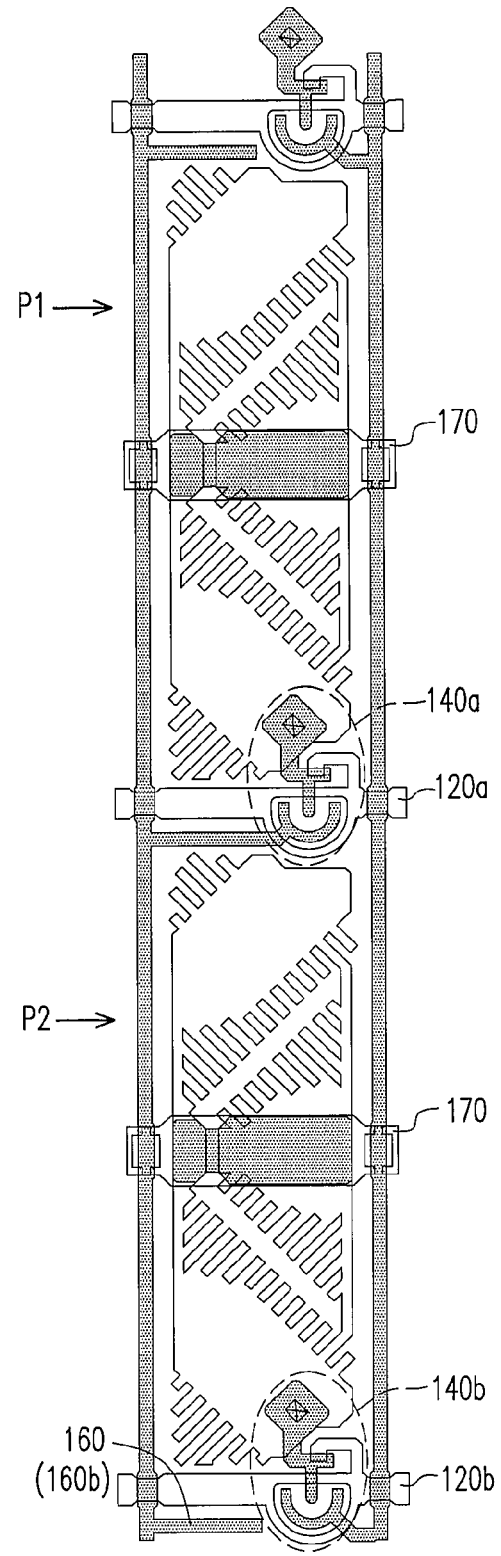
FIG. 5 and FIG. 6 are diagrams illustrating a first pixel P1 and a second pixel P2 according to a third embodiment of the present invention.
Figure 6:
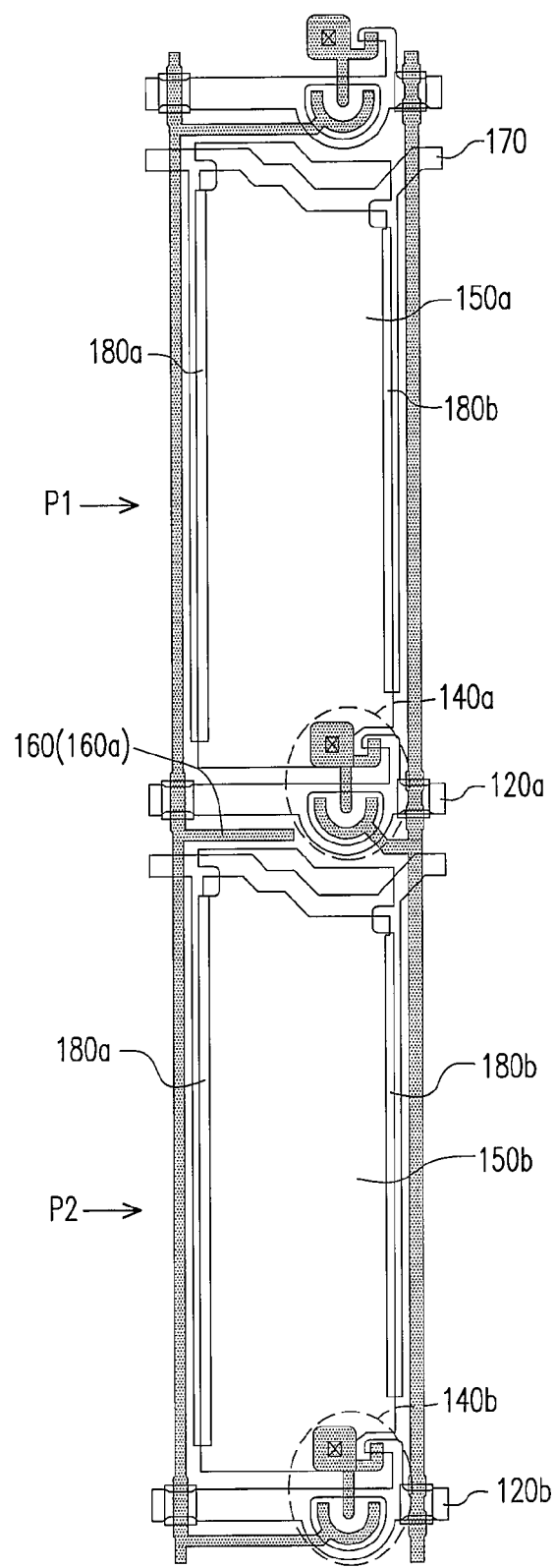

FIG. 5 and FIG. 6 are diagrams illustrating a first pixel P1 and a second pixel P2 according to the third embodiment of the present invention. Referring to FIG. 5, in a general MVA pixel layout, the second pixel P2 may have a second capacitance compensating pattern 160b. Besides, referring to FIG. 6, in a twisted nematic (TN) pixel layout, the first pixel P1 may have a first capacitance compensating pattern 160a.

Referring to FIG. 6, in the present embodiment, each of the pixels P1 and P2 may further include a first shielding pattern 180a and a second shielding pattern 180b, wherein the first shielding pattern 180a is disposed at the edges of the pixel electrodes 150a and 150b and adjacent to one of the adjacent two data lines 130a, the second shielding pattern 180b is disposed at the edges of the pixel electrodes 150a and 150b and adjacent to the other adjacent data line 130b, and the areas of the first shielding pattern 180a and the second shielding pattern 180b are different. In the present embodiment, the first shielding pattern 180a and the second shielding pattern 180b are both strip patterns extended in substantially the same direction as the data lines 130a and 130b. For example, the widths of the first shielding pattern 180a and the second shielding pattern 180b are substantially the same, and the lengths thereof are different. In addition, the widths of the first shielding pattern 180a and the second shielding pattern 180b may also be different, and the lengths thereof may be adjusted accordingly.

It should be noted that in the present embodiment, the first shielding pattern 180a and the second shielding pattern 180b may be electrically connected to a common line 170. The first shielding pattern 180a and the second shielding pattern 180b are disposed at the edges of the pixel electrodes 150a and 150b for shielding the electric fields around the data lines (for example, the electric fields from the data lines) so as to reduce light leakage at the edges of the pixel electrodes 150a and 150b.

Fourth Embodiment

Figure 7:
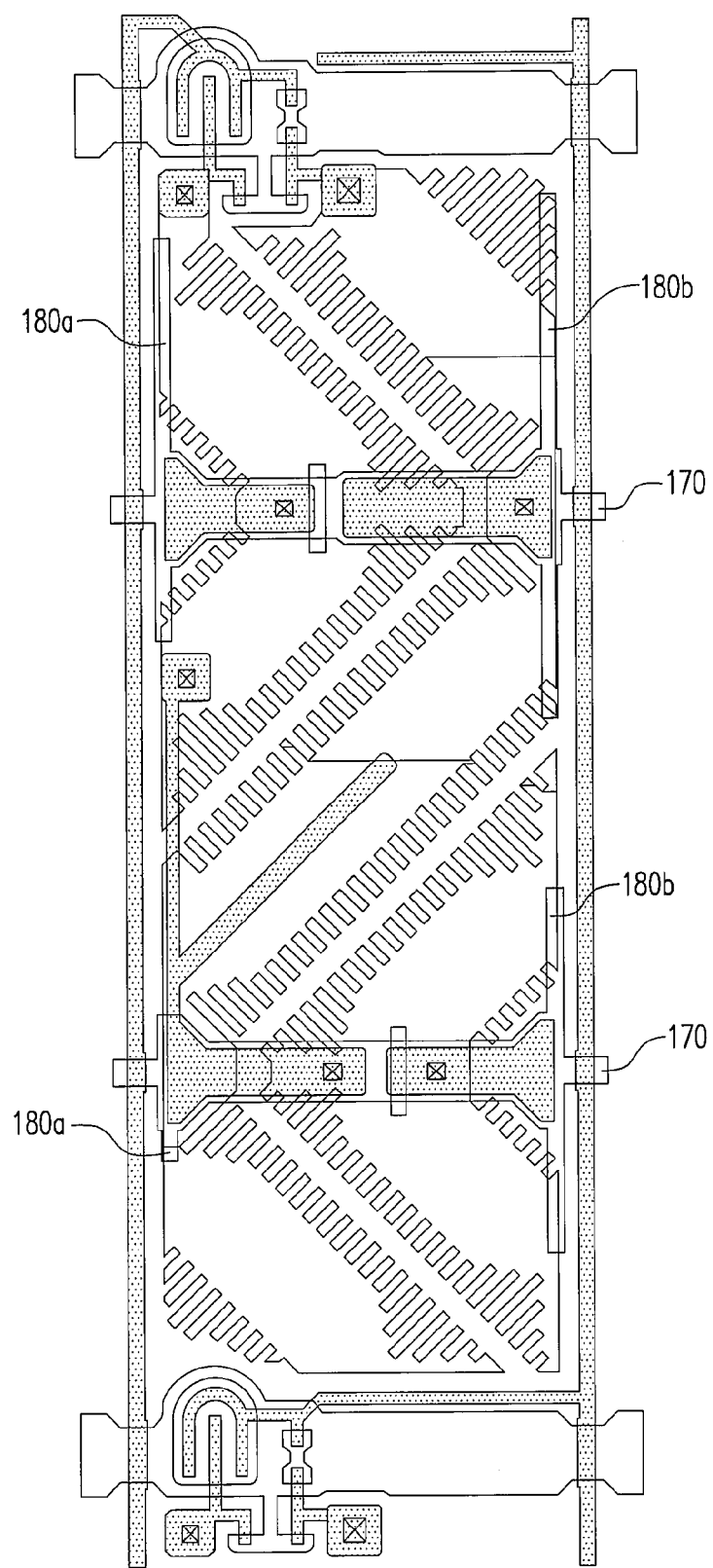
FIG. 7 is a diagram of a pixel layout according to a fourth embodiment of the present invention.

FIG. 7 is a diagram illustrating a pixel layout according to the fourth embodiment of the present invention. Referring to FIG. 7, the pixel layout in the present embodiment is similar to that illustrated in FIG. 6, and the difference between the two is that in the present embodiment, the design of the first shielding pattern 180a and the second shielding pattern 180b is applied in an AMVA pixel layout.

In overview, according to the present invention, a capacitance compensating line is disposed in the pixels so as to reduce inconsistent parasitic capacitances between pixels. Moreover, in some embodiments of the present invention, the shielding patterns disposed at the edges of the pixel electrodes may further reduce inconsistent parasitic capacitances between pixels.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel structure disposed on a substrate, comprising:
a first data line and a second data line disposed on the substrate and substantially in parallel to a column direction;
a first scan line and a second scan line disposed substantially in parallel on the substrate, and the first scan line and the second scan line being crossing and substantially perpendicular to the first data line and the second data line;
a first thin film transistor electrically connected to the first scan line and the first data line;
a first pixel electrode electrically connected to the first thin film transistor;
a second thin film transistor electrically connected to the second scan line and the second data line, the second thin film transistor being substantially aligned to the first thin film transistor in the column direction;
a second pixel electrode electrically connected to the second thin film transistor;
a second extended source electrode electrically connected between the second thin film transistor and the second data line, the second extended source electrode being located adjacent to the second scan line and producing a first parasitic capacitance between the second extended source electrode and the second scan line; and a first capacitance compensating pattern electrically connected with the second data line, the first capacitance compensating pattern extending from the second data line toward the first thin film transistor, the first capacitance compensating pattern being located adjacent to the first scan line and producing a first compensation capacitance between the first capacitance compensating pattern and the first scan line for compensating the first parasitic capacitance produced by the second extended source electrode.

2. The pixel structure according to claim 1, wherein the first thin film transistor and the second thin film transistor are adjacent to the first data line.

3. The pixel structure according to claim 2, wherein the distance between the second thin film transistor and the second data line is larger than the distance between the second thin film transistor and the first data line.

4. The pixel structure according to claim 2, wherein the distance between the second thin film transistor and the second data line is larger than the distance between the first thin film transistor and the first data line.

5. The pixel structure according to claim 1, wherein the first thin film transistor and the second thin film transistor are substantially located at a center between the first data line and the second data line.

6. The pixel structure according to claim 5, wherein the distance between the first thin film transistor and the first data line is substantially the same as the distance between the first thin film transistor and the second data line.

7. The pixel structure according to claim 5, wherein the distance between the second thin film transistor and the second data line is substantially the same to the distance between the first thin film transistor and the first data line.

8. The pixel structure according to claim 5, further comprising a first extended source electrode electrically connected the first thin film transistor to the first data line and located adjacent to the first scan line, and producing a second parasitic capacitance therebetween.

9. The pixel structure according to claim 8, further comprising a second capacitance compensating pattern, wherein the second capacitance compensating pattern is electrically connected to the first data line and located adjacent to the second scan line, and producing a second compensation capacitance produced therebetween for compensating the second parasitic capacitance produced by the first extended source electrode.

10. The pixel structure according to claim 1, further comprising:
a first shielding pattern disposed at the edges of the first pixel electrode and the second pixel electrode and adjacent to the first data line; and
a second shielding pattern disposed at the edges of the first pixel electrode and the second pixel electrode and adjacent to the second data line, wherein the areas of the first shielding pattern and the second shielding pattern are different.

11. The pixel structure according to claim 1, wherein the first shielding pattern and the second shielding pattern are strip patterns extended in substantially the same direction as the first data line and the second data line, the widths of the first shielding pattern and the second shielding pattern are substantially the same, and the lengths of the first shielding pattern and the second shielding pattern are different.

12. The pixel structure according to claim 11, further comprising a common line disposed on the substrate, wherein the first shielding pattern and the second shielding pattern are electrically connected to the common line.

13. The pixel structure according to claim 1, further comprising a common line disposed on the substrate.

14. The pixel structure according to claim 1, wherein each of the first pixel electrode and the second pixel electrode, respectively comprises a bright region sub-pixel electrode and a dark region sub-pixel electrode.

15. The pixel structure according to claim 14, wherein each of the dark region sub-pixel electrodes is electrically connected to one of the scan lines and one of the data lines through an auxiliary transistor.

16. A thin film transistor (TFT) array substrate, comprising:
a substrate;
a plurality of data lines disposed on the substrate and substantially in parallel to a column direction;
a plurality of first scan lines and a plurality of second scan lines disposed alternately and substantially in parallel on the substrate, and the first scan lines and the second scan line being crossing and substantially perpendicular to the data lines;
a plurality of first thin film transistors, each of the first thin film transistor being electrically connected to one of the first scan line and one of the data line, respectively;
a plurality of first pixel electrode, each of the first pixel electrode being electrically connected to one of the first thin film transistor, respectively;
a plurality of second thin film transistors, each of the second thin film transistors being electrically connected to one of the second scan line and one of the second data line, respectively, each of the second thin film transistor being substantially aligned to the first thin film transistor in the column direction;
a plurality of second extended source electrodes, each of the second extended source electrodes electrically connected between the second thin film transistor and the data line, respectively, each of the second extended source electrode being located adjacent to the second scan line and producing a first parasitic capacitance between the second extended source electrode and the second scan line; and
a plurality of first capacitance compensating patterns, each of the first capacitance compensating patterns being electrically connected with the data line, respectively, each of the first capacitance compensating patterns being located adjacent to the first scan line and producing a first compensation capacitance between the first capacitance compensating pattern and the first scan line for compensating the first parasitic capacitance.

* * * * *